US008509355B2

(12) United States Patent
Bradley et al.

(10) Patent No.: US 8,509,355 B2
(45) Date of Patent: Aug. 13, 2013

(54) METHOD AND APPARATUS FOR LOW POWER SIMULTANEOUS FREQUENCY, AUTOMATIC GAIN CONTROL AND TIMING ACQUISITION IN RADIO RECEIVERS

(75) Inventors: Peter Bradley, San Diego, CA (US); Richard F. Woicik, San Diego, CA (US); Andrew M. Bottomley, San Diego, CA (US); Eric D. Corndorf, Minneapolis, MN (US)

(73) Assignee: Medtronic, Inc., Minneapolis, MN (US)

( * ) Notice: Subject to any disclaimer, the term of this patent is extended or adjusted under 35 U.S.C. 154(b) by 890 days.

(21) Appl. No.: 12/165,373

(22) Filed: Jun. 30, 2008

(65) Prior Publication Data
US 2009/0323865 A1  Dec. 31, 2009

(51) Int. Cl.
*H04L 27/22* (2006.01)
(52) U.S. Cl.
USPC ............ 375/329; 375/330; 375/316; 375/343
(58) Field of Classification Search
USPC ................. 455/136; 375/150, 325, 326, 327, 375/329, 330, 343, 345, 347
See application file for complete search history.

(56) References Cited

U.S. PATENT DOCUMENTS

| 3,838,350 | A | * | 9/1974 | Ewanus et al. | 329/308 |
| 4,540,948 | A | | 9/1985 | Ryu | |
| 4,803,438 | A | | 2/1989 | Mizoguchi | |
| 5,103,459 | A | * | 4/1992 | Gilhousen et al. | 370/206 |
| 5,878,087 | A | * | 3/1999 | Ichihara | 375/316 |
| 7,106,803 | B1 | | 9/2006 | Hsu | |
| 2003/0058036 | A1 | | 3/2003 | Stillman | |
| 2009/0103651 | A1 | * | 4/2009 | Lahtonen et al. | 375/330 |

OTHER PUBLICATIONS

S. Kay, "A Fast and Accurate Single Frequency Estimator". IEEE Trans. on Acoustics, Speech and Signal Processing, vol. 37, No. 12, pp. 1987-1990, Dec. 1989.
G. Ren, Y. Chang, Hui Zhang, Huining Zhang, "Synchronization Method Based on a New Constant Envelop Preamble for OFDM Systems". IEEE Trans. on Broadcasting, vol. 51, No. 1, pp. 139-143, Mar. 2005.
T.B. Juang, S.F. Hsiao, "Low Power and Fast CORDIC Processor for Vector Rotation". IEEE, 1999.

* cited by examiner

*Primary Examiner* — Sam K Ahn
*Assistant Examiner* — Janice Tieu
(74) *Attorney, Agent, or Firm* — Stephen W. Bauer; Michael J. Ostrom

(57) ABSTRACT

A method and apparatus are provided for low power simultaneous frequency, automatic gain control and timing acquisition in a low power radio receiver. A baseband signal received is split into a limited signal having limited data and a non-limited signal. The limited signal is fed through a limited phase-shift keying (PSK) correlation path in which a PSK correlator operating on the limited signal simultaneously determines coarse frequency estimations, timing estimations, and packet synchronization detection. The non-limited signal is fed through an automatic gain control path where automatic gain control is performed on the non-limited signal simultaneously with the coarse frequency and timing estimations and packet synchronization detection performed by the PSK correlator. By operating the PSK correlator on limited data from the received baseband signal and through a separate path from the automatic gain control, substantial power savings are achieved without degrading performance since the preamble time is significantly reduced.

21 Claims, 6 Drawing Sheets

METHOD AND APPARATUS FOR LOW POWER SIMULTANEOUS FREQUENCY, AUTOMATIC GAIN CONTROL AND TIMING ACQUISITION IN RADIO RECEIVERS

TECHNICAL FIELD

This disclosure relates generally to communications technology and more particularly to a radio receiver capable of low power simultaneous frequency, automatic gain control and timing acquisition.

BACKGROUND

Medical implants often utilize communication systems in order to transmit information between the medical implants and external devices. Communication systems in medical implants demand very low power consumption due to battery supply limitations. To reduce overall energy consumption, the exchange of data should be performed efficiently. In turn, efficient packet exchange between the medical implant and the external device requires minimization of the time required to setup the receiver prior to demodulating data. This is especially important for communication systems with small amounts of data to transfer where, in these cases, the radio setup time can be a significant proportion of the overall communication time.

Conflicting with the need for small receiver setup times, modern receivers require several adjustments in order to optimally receive data. These adjustments include gain adjustments, compensation for frequency differences between receiver and transmitter local oscillators, and determining bit timing for data demodulation. To facilitate radio receiver setup, a signal called a preamble is often placed in a data packet prior to the actual data in the payload. The preamble can be used to provide information to acquire frequency, gain settings and timing and setup the overall radio prior to receiving the payload.

Medical implants along with other small and low power applications use simple quartz crystal based oscillators that are not temperature compensated. Larger, higher power and accurate temperature controlled crystal oscillators are not capable of being used. This results in a relatively inaccurate frequency reference that is relative large (+/−20 kHz) and approaches the typical data rates (50-200 kbps). Consequently local oscillators used in transmitters and receivers in low power applications have inaccuracies that need to be handled through the use of automatic frequency control systems.

Prior to receiving the payload, radio receivers in a communication system must typically perform the following operations: (i) adjust the carrier frequency to match the incoming carrier frequency given the relatively large frequency offsets, (ii) acquire timing information to optimally sample the received signal in the center of each bit, (iii) reliably identify the beginning of the packet for synchronization purposes, (iv) adjust amplifier gains to avoid saturating filter stages and optimize signal levels into analog to digital converters, and (v) remove DC offsets which is especially important in direct conversion architectures. These setup operations can occupy a significant proportion of the overall communication time when the amount of data to be transferred is small, thereby also consuming a significant amount of power.

SUMMARY

In one or more embodiments, a method and apparatus are provided for low power simultaneous frequency, automatic gain control and timing acquisition in a low power radio receiver. For a radio frequency (RF) baseband signal received by the radio receiver, the baseband signal is split into a limited signal having limited data and a non-limited signal. The limited signal is fed through a limited phase-shift keying (PSK) correlation path in which a PSK correlator operating on the limited signal simultaneously determines coarse frequency and timing estimations as well as packet synchronization detection. The non-limited signal is simultaneously fed through an automatic gain control path where automatic gain control is performed on the received baseband signal substantially simultaneously with the coarse frequency and timing estimations and packet synchronization detection performed by the PSK correlator in the limited phase-shift keying (PSK) correlation path. By operating the PSK correlator on limited data from the received baseband signal and through a separate path from the automatic gain control, substantial power savings can be achieved since the parallel approach reduces the required preamble time.

In one or more embodiments, the PSK correlator is a Differential Binary Phase Shift Keying (DBPSK) sample based correlator that operates at a sample rate of the received baseband signal, where the sample rate is much faster (e.g., 10-20 times) than the symbol rate of the received baseband signal.

In one or more embodiments, a method and apparatus are provided for performing coarse frequency and timing estimations and fine frequency and timing estimations in separate stages. Initially, in a first stage, coarse frequency and timing estimations are performed by a DBPSK correlator on a limited version of a baseband signal having only limited data. The DBPSK correlator further performs packet synchronization detection on the limited signal simultaneous with the coarse frequency and timing estimations. Also in the first stage, automatic gain control is performed on a non-limited version of the baseband signal substantially simultaneously with the coarse frequency and timing estimations and packet synchronization detection performed by the DBPSK correlator. After the simultaneous automatic gain control and coarse frequency and timing estimations have been completed in the first stage, a second stage is employed in which fine frequency and timing estimations are generated using the non-limited version of the baseband signal. This staged approach allows gain settings from the automatic gain control to be correct before the fine frequency and timing estimations are generated, thereby allowing the use of fast and accurate algorithms for performing these operations in a efficient and fast manner with low power consumption.

DRAWINGS

The above-mentioned features and objects of the present disclosure will become more apparent with reference to the following description taken in conjunction with the accompanying drawings wherein like reference numerals denote like elements and in which.

DETAILED DESCRIPTION

Figure 1:
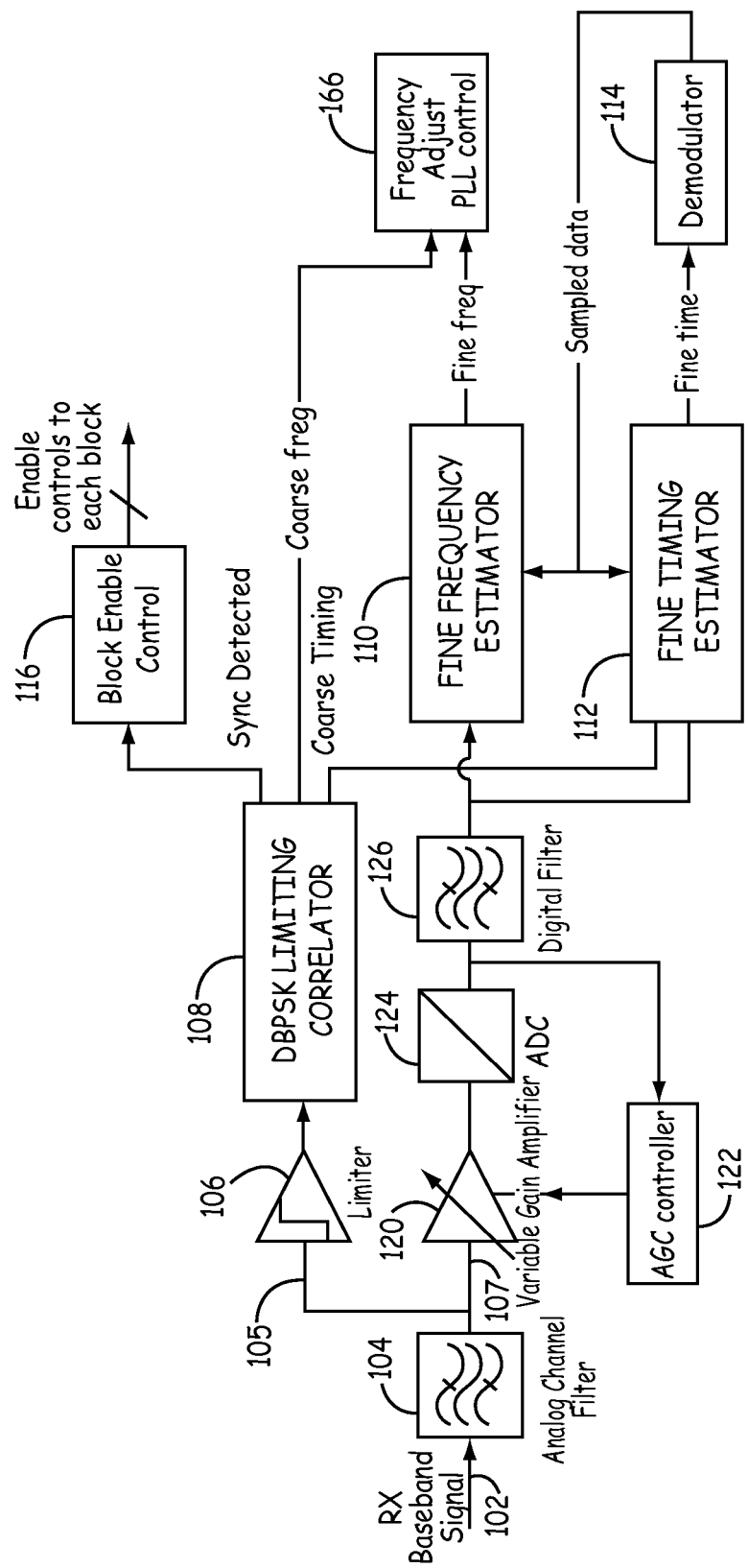
FIG. 1 is a block schematic diagram of a receiving architecture in accordance with one or more embodiments of the present disclosure.

A method and apparatus are provided for simultaneous frequency, automatic gain control and timing acquisition in a radio receiver in a very efficient and fast manner while achieving low power consumption. In one or more embodiments, a receiving architecture 100, as illustrated in the block schematic diagram of FIG. 1, is provided for receiving a baseband signal 102 transmitted to a device in which the receiving architecture 100 is implemented. An analog channel filter 104 filters a desired range of RF frequencies at which the receiving architecture 100 is designed to operate from the baseband signal 102. The filtered signal is then split and simultaneously sent through a limited phase-shift keying (PSK) correlation path and an automatic gain control path in order to acquire frequency and timing information simultaneously with automatic gain control.

In one or more embodiments, in the limited phase-shift keying (PSK) correlation path, the filtered signal is passed through a limiter 106 and a limited PSK signal containing limited data is generated and passed through a PSK correlator 108 where coarse frequency and coarse timing estimations are provided along with packet detection procedures. In one or more embodiments, the PSK correlator 108 is a limited Differential Binary Phase Shift Keying (DBPSK) correlator. Differential phase shift keying (DPSK) offers many benefits for data transfer, such as 3 dB better sensitivity over frequency or amplitude shift keying techniques. In one or more embodiments, the DBPSK may be implemented with each phase shift represented by a +/−π/2 for binary data. One advantage associated with these phase shifts is that large amplitude excursions are minimized which reduces requirements on transmitter and receiver linearity. Further, a differential scheme does not require a coherent receiver thereby offering simplifications and lower power consumption in the receiver.

In contrast to prior conventional low power communication systems which first acquire frequency and timing information and then perform packet synchronization by recognizing a particular symbol sequence using a correlator operating at the symbol rate, in one or more embodiments the PSK correlator 108 runs at a much faster sample rate (e.g., 10-20 times the symbol rate) to simultaneously obtain frequency, timing and packet detection. With conventional correlator architectures, when operating at the symbol rate, the gain settings require adjustment beforehand thus costing time and additional power consumption. However, the improved architecture of the PSK correlator 108 is designed to circumvent such issues.

The correlator 108 is run on a limited PSK correlation path 105 that is separate from an automatic gain control path 107. When using a DBPSK signal, limiting does not significantly degrade performance of the correlator 108 yet significant power is saved in the digital processing. The correlator 108 is run at the sample rate which is significantly greater than the symbol rate in order to provide reasonable timing information for the center of the bit. The correlation algorithms run by the correlator 108 are used to generate coarse frequency and timing estimations as well as packet detection.

By using a separate limiting receiver path 105 from the automatic gain control path 107, automatic gain control (AGC) algorithms can be run simultaneously during the correlation algorithms run by the correlator 108. This allows the gain settings to be correct before subsequent fine frequency and timing phases are performed, thereby allowing the use of fast and accurate algorithms for the fine frequency and timing phases for refinement of timing and frequency. In one or more embodiments, in the automatic gain control path 107, the filtered received baseband signal 102 is passed through a variable gain amplifier 120 that is controlled by an automatic gain controller (AGC) 122. The output of the variable gain amplifier 120 is then fed through an analog-to-digital converter (ADC) 124, where the output of the ADC 124 is then digitally filtered by digital filter 126. The output of the digitally filtered signal is then used for fine frequency and timing estimations when required. The output of the ADC 124 is further fed back to the AGC controller 122 for further use in controlling the variable gain amplifier 120. In one or more embodiments, it is possible to run the ADC 124 at single bit resolution to save current.

Estimation algorithms for timing and frequency may be generally classified into two categories: feedforward or feedback. Feedforward algorithms are faster but usual suffer from limited acquisition range whilst feedback algorithms are slow but with a wide acquisition range. In addition, fast frequency acquisition algorithms usually require timing information. Conversely, fast timing acquisition algorithms usually require frequency information. Thus in order to use the most accurate, fastest feedforward algorithms, an early estimate of timing and frequency is needed.

Low power communication systems have historically used slow feedback frequency and timing algorithms that precede a symbol based correlator. In one or more embodiments, the receiving architecture 100 includes a sample based correlator 108 that allows use of feedforward algorithms for refinement of timing and frequency, thereby providing much quicker determinations than prior symbol based correlators which also results in a savings in power consumption.

In one or more embodiments, the coarse frequency and timing determinations by the correlator 108 may provide sufficient frequency and timing accuracy without need for fine tuning. In one or more embodiments, for optimal performance of a DPSK demodulator, accurate frequency and timing information is desirable and a fine frequency estimator 110 and fine timing estimator 112 are also provided for respectively providing fine frequency and timing estimations. In one or more embodiments, the fine frequency estimator 110 generates a fine frequency estimation using a Kay weighted phase averager with additional detection and correction of noisy data. This fine frequency estimation algorithm is a fast feedforward technique that is suitable for low power applications since it operates at the incoming symbol rate. The algorithm, in order to save power, uses only a small number of symbols, e.g., 20-30 symbols. However, noise in any one sample, especially in low signal to noise conditions, will induce significant errors in the frequency estimate due to noise effects and phase wrapping in the argument function. Thus, a specially developed heuristic algorithm is provided to reduce errors due to this phenomenon. In one or more embodiments, the fine timing estimator 112 generates a fine timing estimation using a decision-directed zero-crossing detector (ZCD), while it is understood that other suitable timing algorithms could also be utilized.

DBPSK Limiting Correlator

The correlator 108 is filter matched to an expected signal pattern, such that it can have excellent noise and spurious signal rejection qualities depending on the length and uniqueness of the pattern. For a complex received signal r(t) and an expected complex signal pattern s(t) of duration T, the correlator function is defined as:

$$Z(t)=\int_0^T r(\tau+t-T)s(\tau)^* d\tau \text{ where * is the conjugate operator.}$$

At time t=T, the received signal is aligned with the expected pattern, and then the correlation magnitude is at a peak:

$$P(T)=|Z(T)|=|\int_0^T r(\tau)s(\tau)^* d\tau|$$

The correlation function also has the useful property $\angle Z(T)=0$ when the pattern is aligned. For discrete application with a received sampled time sequence, $\{r_d\}$, the correlation function, Z(d) is given by:

$$Z(d) = \sum_{l=0}^{L-1} r_{l+d-(L-1)} s_l^*$$

where L is the number of samples in correlation and S is the correlation pattern. When r is aligned and matching with S, the magnitude of the correlation function is maximized.

Figure 2:
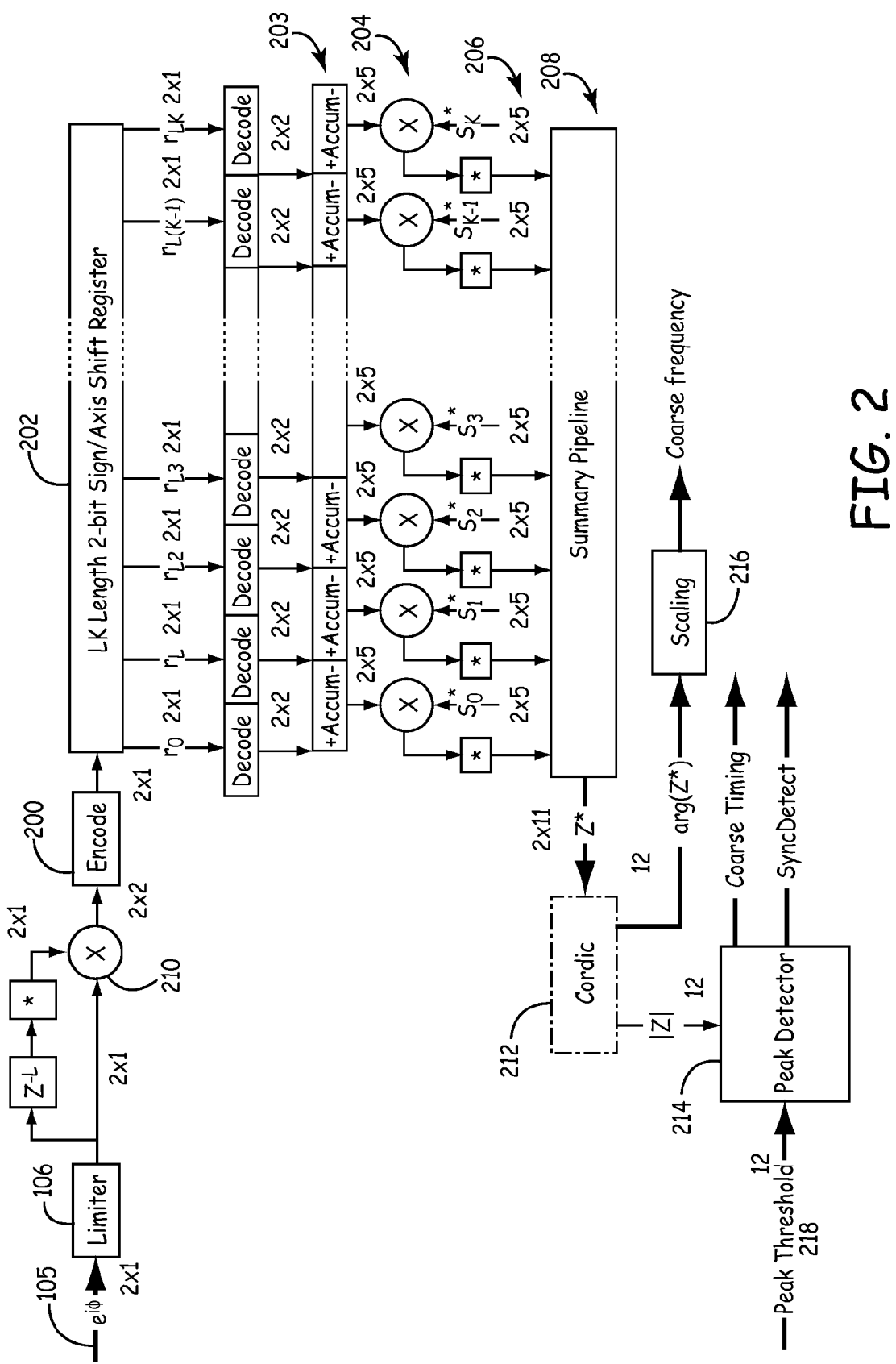
FIG. 2 is a block schematic circuit diagram of a DBPSK correlator in accordance with one or more embodiments of the present disclosure.

Referring now to FIG. 2, a block schematic illustration of the correlator 108 is provided in accordance with one or more embodiments. For hardware implementation of the discrete function, the received signal, r, is encoded by encoder 200 and assigned to a shift register 202. When the correlation signal consists of K symbols of L samples, the shift register 202 may comprise a 2-bit sign/axis shift register having a length of K symbols×L samples. For simplicity in mathematical notation, a convention is used that $r_o$ contains the newest sample and $r_{L-1}$ the oldest sample. The d subscript may be dropped by considering the simple case where the shift register is just full with samples from $r_{L-1}$ to $r_o$ and therefore d=L-1. Implementation through a product integrator can then be represented by the simplified equation:

$$Z = \sum_{l=0}^{L-1} r_l s_l^*$$

When the correlation signal consists of K symbols of L samples each, the symbols can be separately correlated with the equivalent function. By way of example without limitation, in one particular example embodiment K is 60 and L is 10.

$$Z = \sum_{k=0}^{K-1} \sum_{l=0}^{L-1} r_{kL+l} s_{kL+l}^*$$

To minimize the implementation gate count and current consumption, the design of the correlator 108 correlates with the pre-filtered transmitted symbols so that the correlation equation becomes:

$$Z = \sum_{k=0}^{K-1} \left[ s_k^* \sum_{l=0}^{L-1} r_{kL+l} \right]$$

This simplifies the design by reducing the number of complex symbol integrators 203, multipliers 204 and inputs 206 into the summing pipeline 208. For example, in the representative embodiment where K is 60, the design is simplified by reducing it to an array of 60 complex symbol integrators 203, 60 complex constant multipliers 204 and two 60 input summing pipelines 208. In one or more embodiments, the 60 complex integrators 203 of the last equation can be mathematically substituted with $c_k$:

$$Z = \sum_{k=0}^{K-1} s_k^* c_k \text{ where } c_k = \sum_{l=0}^{L-1} r_{kL+l}$$

It can be seen from the above that the function $c_k$ only changes at the summation extremes as new data is shifted into the shift register 202. Each complex integrator 203 is implemented with two accumulators which reduces the summation to two adds and subtracts at each sample time:

$$c_k(d+1)=c_k(d)+r_{kL}-r_{(k+1)L}$$

The d notation can be re-invoked to represent different time steps in the sequence of input data. This iterative form of the summation offers significant power consumption savings and a simplified implementation.

The differential correlation symbols for Pi/2-DPSK, are $s_k = e^{jq_k\pi/2}$, $q_k = \pm 1$, where the sequence of symbols $q_k$, k=0 to K-1 are selected for optimal correlation properties. Sequences with high aperiodic autocorrelation properties and binary balance are preferable.

The transmitted signal is $e^{jd_k\pi/2} e^{j\phi_{k-1}}$ where $\phi_{k-1}$ is the transmitted phase at the previous symbol. The receiving architecture 100 receives an I/Q signal represented by $e^{j\phi_k}$, where $\phi_k$ is the phase of the $k^{th}$ symbol time. To further reduce the implementation gate count, the I/Q signals are limited to ±1, resulting in four possible values. The received differential symbols are calculated before entering the shift register 202 by a differential multiply 210 on the limited unfiltered input values: $r_0 = e^{j\phi_0} \cdot e^{-j\phi_{-L}}$. The value $e^{-j\phi_{-L}}$ is recovered from an input shift register, L samples long. The multiply results in four possible values located on the constellation axes that are stored in a 2-bit shift register. The values are encoded to 2 bits to identify the axis and the sign of the complex differential symbol. The shift register $r_{kL+}$ stores axis/sign-encoded values that are decoded to among the set [+1, 0, -1] for each axis at each tap $r_{kL}$ before accumulation.

When the incoming symbols are aligned in the integrators 203:

$$c_k = e^{j\phi_k} \cdot e^{-j\phi_{k-1}} = e^{jd_k\pi/2}$$

A frequency deviation, $f_d$, may be introduced into the received signal, $e^{j\phi_k} e^{j(2\pi f_d k T_s + \theta)}$, where $T_s$ is the symbol interval and θ is an arbitrary constant phase offset. The constant drops out at the input differential multiplier leaving the symbols and frequency deviation at the correlator 108 output:

$$c_k = e^{j\phi_k} e^{-j\phi_{k-1}} e^{j2\pi f_d T_s} = e^{jd_k\pi/2} e^{j2\pi f_d T_s}$$

Considering L samples per symbol, the aligned correlator 108 output then is:

$$Z = \sum_{k=0}^{K-1} L e^{jd_k \frac{\pi}{2}} e^{-jd_k \frac{\pi}{2}} e^{j2\pi f_d T_S} = KL e^{j2\pi f_d T_S}$$

Assuming that $f_d < 1; 2T_s$, the frequency error is derived at the correlation peak using a function that can calculate the argument of a complex number. In one or more embodiments, a Coordinate Rotation Digital Computer (CORDIC) module 212 is one such commonly used module employing such an algorithm, although other methods known to those skilled in the art could also be utilized. The desired calculation for frequency is given by the following equivalent function.

$$f_{d(coarse)} = \frac{\angle Z}{2\pi T_S}$$

The correction value applied to the local frequency oscillator associated with the receiving architecture 100 is $(-f_d)$. The CORDIC module 212 also outputs the magnitude of Z used by a peak detector 214 for peak detection. The position of the peak coincides with the end of the received correlation pattern and is used to initialize the circuitry for the fine symbol timing estimator 112.

In one or more embodiments, the correlator 108 generates a complex output signal arg ($Z^*$) which is then scaled in scaling block 216 from which from which coarse frequency may be derived using the above equation for $f_{d(coarse)}$. The correlator 108 is filter matched to the sync pattern that rejects Gaussian noise and systemic distortion. The magnitude of the output of the correlator 108 peaks when a received signal matches the expected sync pattern. The peak detector 214 uses a minimum peak threshold reference value 218 to distinguish correlation peaks from spurious noise. The timing of the detected peak is used to align the symbol clock generator as well as to identify the frame sync symbol location and presence. The phase is used to correct any frequency offset. The phase is shown to be proportional to frequency offset when correlating differential symbols.

In one or more embodiments, coarse frequency and timing estimations and fine frequency and timing estimations are performed in separate stages. Initially, in a first stage, coarse frequency and timing estimations are performed by the DBPSK correlator 108 on a limited version of a baseband signal having only limited data. The DBPSK correlator further performs packet synchronization detection on the limited signal simultaneously with the coarse frequency and timing estimations. Also in the first stage, automatic gain control is performed on a non-limited version of the baseband signal substantially simultaneously with the coarse frequency and timing estimations and packet synchronization detection performed by the DBPSK correlator 108. After the simultaneous automatic gain control and coarse frequency and timing estimations have been completed in the first stage, a second stage is employed in which fine frequency and timing estimations are generated using the non-limited version of the baseband signal. This staged approach allows gain settings from the automatic gain control to be correct before the fine frequency and timing estimations are generated, thereby allowing the use of fast and accurate algorithms for performing these operations in a efficient and fast manner with low power consumption.

Fine Frequency Estimation

In one or more embodiments, the receiving architecture 100 further includes a fine frequency estimator 110 that generates a fine frequency estimation. In one or more embodiment, the fine frequency estimator 110 employs a modified Kay weighted phase averager algorithm that calculates the weighted average phase difference (note: arg{z(k)z* (k−1)}=arg{z(k)}−arg{z(k−1)}). This algorithm does not suffer from phase wrapping. The phase difference estimates are a colored Gaussian noise process so the weighting is chosen to minimize the frequency estimation variance given the coloring. To improve performance at low SNR, a correction for the effects of noisy data is further provided.

Figure 3:
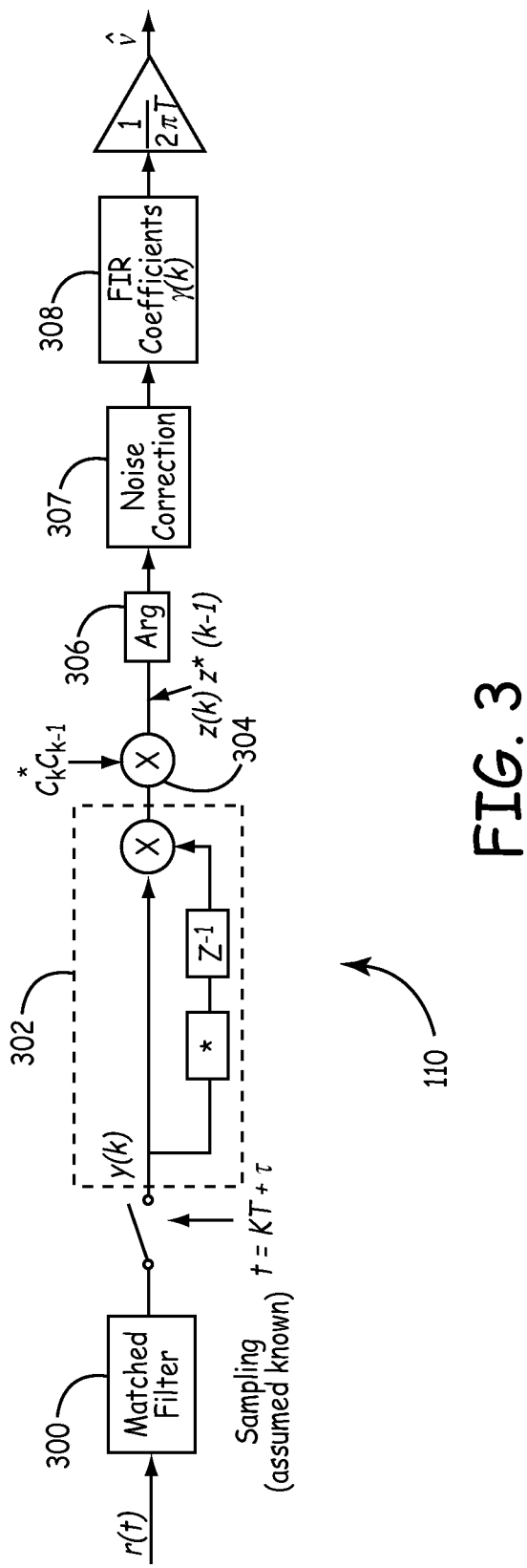
FIG. 3 is a block schematic illustration of a fine frequency estimator in accordance with one or more embodiments of the present disclosure.

Referring now to FIG. 3, a schematic block illustration of the fine frequency estimator 110 is provided in accordance with one or more embodiments. The complex received signal r(t) that is output from the automatic gain control path is fed into a matched filter 300 in the fine frequency estimator 110. For a sampling t=KT+t, phase differencing 302 is performed and the signal is multiplied 304 by known data $c_k^* c_{k-1}$ to output the signal z(k) z*(k−1), such that the a phase differencer available within the demodulator 114 can be reused. $C_k$ is the raw non-differential ideal data, $c_k c_{k-1}^*$ is the differential phase data, and $c_k^* c_{k-1}$ is its conjugate. In this manner, the signal is multiplied at 304 by the conjugate of the expected differential data.

The multiplication by known data removes the modulation from the signal and also simplifies the multiplication process since $c_k c_{k-1}^* = +j, -j$ in DBPSK. Multiplying a complex signal by +,−j becomes a trivial sign change and I, Q swap (That is . . . (a+jb)j−>(aj−b) or ((a+jb)−j−>(−aj+b)).

The argument 306 of the signal is then obtained, noise correction 307 is performed on the argument 306, and weighted estimators are generated using filter coefficients γ(k) in operational block 308 as determined by the following equations:

$$\gamma(k) = \frac{3}{2} \frac{L_0}{L_0^2 - 1} \left[1 - \left(\frac{2k - L_0}{L_0}\right)^2\right] k = 1, 2, \ldots, L_0 - 1$$

$$\hat{v} = \frac{1}{2\pi T} \sum_{k=1}^{L_0-1} \gamma(k) \arg\{z(k) z^*(k-1)\}$$

weighted phase averager $$\hat{v} = \frac{1}{2\pi T} \arg\left[\sum_{k=1}^{L_0-1} \gamma(k) z(k) z^*(k-1)\right]$$

weighted linear predictor
where the unweighted estimators use filter coefficients given by $$\gamma(k) = \frac{1}{L_0 - 1} k = 1, 2, \ldots, L_0 - 1$$

Under conditions of low SNR, the Kay weighted phase averager algorithm employed by the fine frequency estimator 110 can experience occasional erroneous data and possible phase wrapping at the output of the argument function 306, which could cause an error of ~γ(k)×T~ in the estimation which is unacceptably high. As described above, the Kay weighted phase averager algorithm multiplies the incoming differential data with the conjugate of the expected data at 304 in order to remove the data component from the signal, with the remaining information representing the frequency offset. Noise in the signal can corrupt this frequency information.

An excessive noise handler algorithm was developed heuristically based on the following observations. Erroneous measurements are often characterized by two extreme cases in a row since noise corrupts two symbols of the differential detector. In some cases, the errors occur so that they effectively cancel each other and no correction is required. This is seen as two large signals of opposite polarity. Occasionally, 3 high values in a row may be seen which would fool simplistic algorithms, such as (correct×ifx>threshold). The output when phase wrapping occurs may be unpredictable since the data is highly influenced by noise. Theoretically the error on a phase wrap is $2\pi$ but due to the noise this correction can be excessive. In essence, the information content of such samples is small since they are dominated by noise. Erroneous large signals are the primary offenders since they produce the largest errors. In fact, large signals may not be due to phase wrapping but could purely be the product of noise. The polarity of the correction required depends on the polarity of the large extreme samples. Frequency estimation algorithms tend to be sensitive to burst errors, and the only way to handle the rare extreme errors in estimation is to ignore the frequency estimate if it exceeds certain bounds and simply uses the coarse frequency estimate only.

Based on these observations, a simple heuristic algorithm was developed for an excessive noise handler to provide simple correction mechanism based on observations of noise-induced errors.

In one or more embodiments, the excessive noise handler utilizing the following algorithm:

```
limit=2; % in radians, adjustable value, 2 is typical
[y] = noise_correction (x,limit);
begin
    if abs((x+x⁻¹)/2)>limit) && (abs(x)>limit) && (corrected⁻¹==0),
        y = -x;
        corrected = 1;
    else
        y = x;
        corrected = 0;
    end
end
% where,    x = input, y = output
           abs = absolute value function
           x⁻¹ = previous sample of the input x
           corrected⁻¹ is high if the previous sample was corrected
```

The limit=2 was set by observing instances of erroneous measurements. For the frequency offsets that this algorithm measures, the input x will typically be within +/−1. If two consecutive averaged values are too high or low, then correction is performed. Correction is not performed if the previous value was already corrected (corrected⁻¹=1). The current value is then canceled to zero by subtracting x and the previous large value is negated by subtracting another x, which works out equivalent to simply changing sign.

In one or more embodiments, a burst error handler may further be provided for handling burst errors, according to the following algorithm:

```
if abs(fine_frequency_estimate)<max_expected_estimate
    update PLL with fine_frequency estimate
else
    do not update PLL with fine_frequency estimate (only use coarse
    estimate)
end
```

The max_expected_estimate is the maximum expected frequency estimate for the system.

A variety of possible frequency correction algorithms were considered including: 1) the detection of two consecutive bit-errors, 2) the detection of two consecutive high values from the argument as described above, and 3) limiting the argument output. In the consecutive bit-errors detection algorithm (method 1), if consecutive bit-errors are detected, then the values are subtracted (i.e., ignored). In the consecutive high values from argument detection algorithm (method 2), if abs((x+x⁻¹)/2)>limit) && (abs(x)>limit) && (corrected⁻¹==0), then the output (z) of the argument function is inverted and not performed two times in a row. In the limit argument output detection algorithm (method 3), the argument output is limited to a specified maximum saturation level since, for relatively small frequency offsets, the argument output should not be excessively large. A saturation value of 1 was selected based on determinations from iterative simulations and consideration of the contribution of each sample to the frequency estimate.

Simulations for these three frequency correction methods were run at an EbNo level 1.7 dB below sensitivity to increase the probability of large frequency estimation errors. The number of sync attempts was selected to be 10000 to provide reliable statistics. A normalized cumulative distribution function was calculated from the data that estimates the probability that a frequency error exceeds values given on the x-axis, for a variety of frequency correction methods, as illustrated in FIG. 4.

Figure 4:
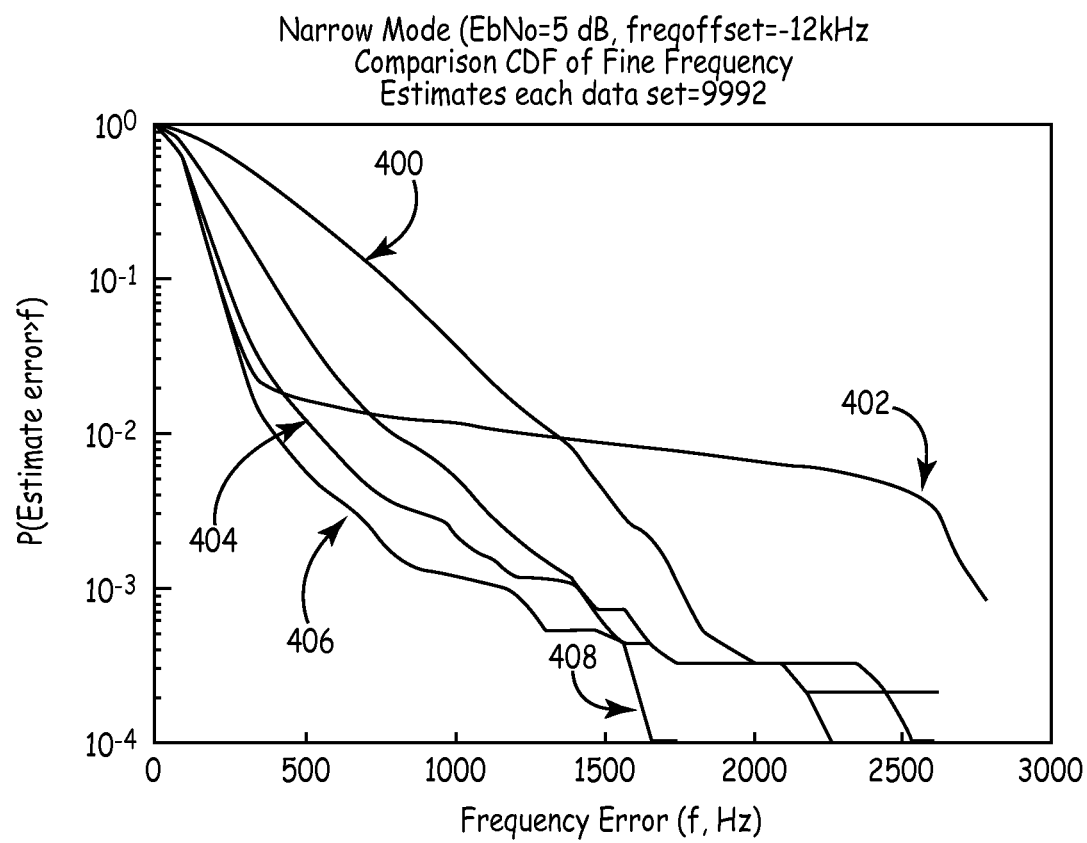
FIG. 4 is graphical illustration of a comparison of frequency errors associated with a variety of frequency correction methods.

In FIG. 4, line 400 represents the coarse frequency estimation, line 402 represents the fine frequency estimation with no correction, line 404 represents the fine frequency estimation using correction method 1, line 406 represents the fine frequency estimation using correction method 2, and line 408 represents the fine frequency estimation using correction method 3. From this and considering the probability greater than 500 Hz, it is observed that the consecutive high values from argument detection algorithm (method 2) clearly provides the best results of being twice as good as the consecutive bit-errors detection algorithm (method 1) and almost 4 times better than if no correction were performed at all. The consecutive high values from argument detection algorithm works well because it is not excessively sensitive and is designed to be specific to the cases that cause frequency estimation errors.

In one or more embodiments, the consecutive high values from argument detection algorithm can be used with a programmable limit value. The weighting filter 308 may be implemented without storing samples in a delay line since only a single result (i.e., a frequency estimate) is required. In one or more embodiments, a simple multiplier and accumulator will suffice followed by quantization to the PLL step resolution for PLL control in PLL control block 166. Further, in one or more embodiments, the arctan function and input phase differencer (delay and multiply) may be reused from the correlator 108 and demodulator 114 respectively.

Fine Timing Estimation

In one or more embodiments, the receiving architecture 100 further includes a fine timing estimator 112 that generates a fine timing estimation. In one embodiment, the fine timing estimator 112 uses a decision-directed zero-crossing detector in view of the lower power consumption associated with using decisions (single bit data) as opposed to other algorithms such as a Gardner detector which do not use decisions. In addition the decision directed algorithm is less sensitive to gain errors.

In one or more embodiments, the preamble fine timing estimator 112 provides time estimates in a plurality of samples to the fine frequency estimator 110 as required for the fine frequency estimation. For fast estimation, a data or decision aided detector is preferred with zero-crossing detection due to superior performance. The decision-directed ZCD operation is summarized by the following equation.

$$e(k) = (\hat{c}_{k-1} - \hat{c}_k) y(kT - T/2 + \hat{\tau}_{k-1})$$

where $\hat{c}_k$ is the bit decision data (in bipolar form) and $y(kT-T/2+\hat{\tau}_{k-1})$ is the input to the bit decision block in between the bit decision at k and k−1. This term represents the zero-crossing and is zero if the timing estimate is correct. The error term is accumulated and if the accumulation exceeds a certain threshold the timing point is appropriately adjusted with the timing point advanced or retarded depending on the sign of the error.

By using the decision directed ZCD for the fine timing estimator 112, then the only difference between the ZCD for preamble and for data payload is the accumulator threshold, which may be set to a higher value in the later case. The average amplitude of the signal is a parameter in the loop dynamics. An increase in signal amplitude will increase the loop gain, which is equivalent to reducing the accumulator threshold. The fact that the AGC (and gain) has settled prior to the operation of the fine timing is important for this reason. The decision directed form of this estimator is also less sensitive to errors in the gain setting since the $\hat{c}_k$ terms in the error estimation are always +/−1.

In one or more embodiments, the data pattern sent during the fine timing estimation phase is the pattern 110 repeated 10 times for a total of 30 symbols of BPSK data. This pattern is selected since it provides the maximum number of zero-crossings (2 every 3 symbols) in DBPSK whilst still presenting a signal which is DC balanced (i.e., rotates around the constellation with DC neutrality in the I and Q signals).

Demodulator

Figure 5:
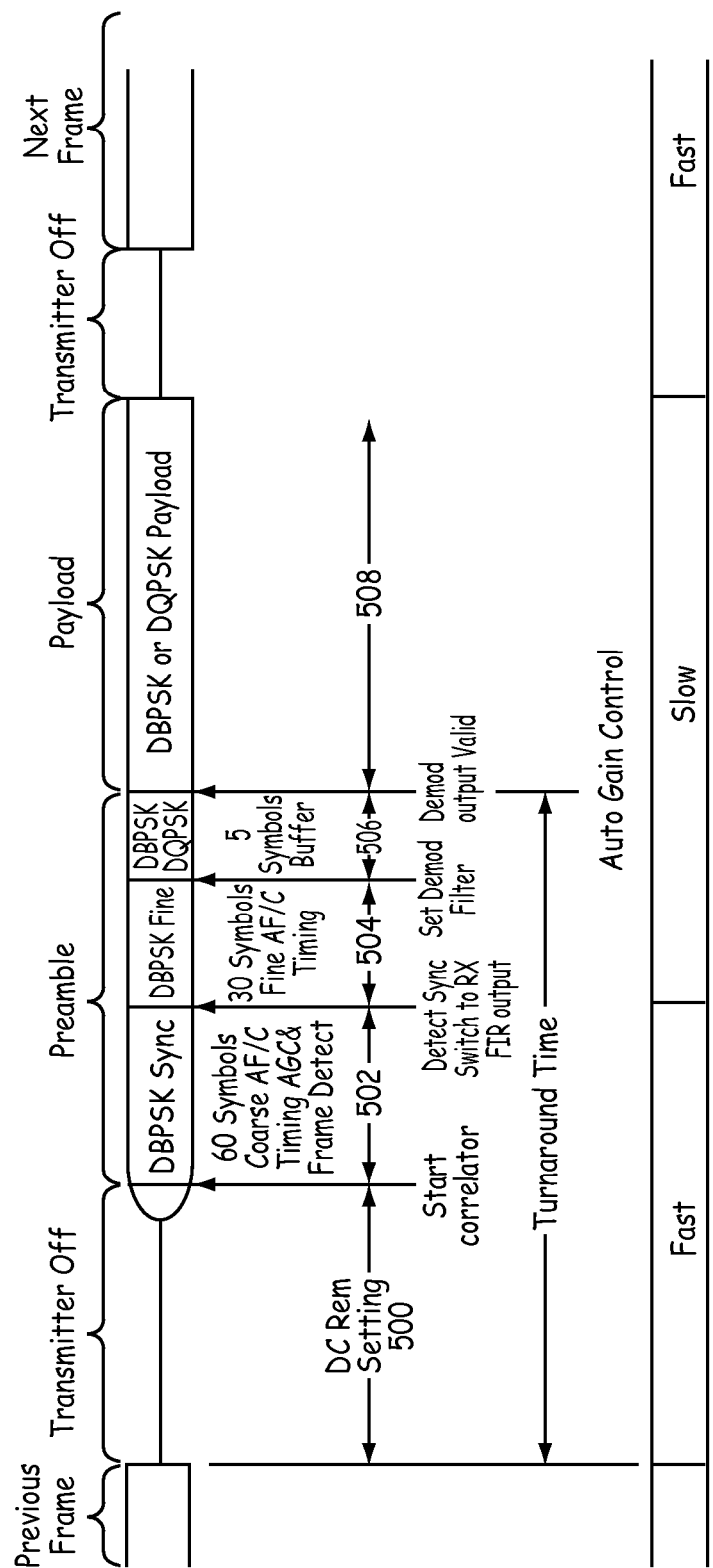
FIG. 5 is a timing diagram showing the timing of the correlator and automatic gain control operations performed in accordance with one or more embodiments of the present disclosure.

In one or more embodiments, the receiving architecture 100 further includes a demodulator 114 including a filter that is used to derive an improved estimate of the reference phase. The first order Infinite impulse response (IIR) digital filter has a single coefficient. The coefficient is set for minimal filtering during the fine timing/frequency estimation phases since the frequency and timing estimates have not been fully refined. The filter is set to the payload value (with more averaging) immediately following this phase and the filter settles during a 5 symbol transition phase between the fine estimation and payload as shown in the timing diagram The operation of the receiving architecture 100 in accordance with one or more embodiments will now be described with reference to the timing diagram of FIG. 5. Following the DC removal and settling phases (500) of the preamble of a received frame in the received baseband signal 102, the correlator 108 is started to simultaneously obtain frequency, timing and Sync packet detection during the DBPSK Sync period (502). In one or more embodiments, the DBPSK Sync period (502) may include 60 symbols. If the Sync packet is detected, the coarse frequency and coarse timing values are updated, the correlator 108 is turned off and the fine frequency estimator 110, fine timing estimator 112 and demodulator 114 are turned on through a block enable control device 116 that enables control to each block. Such control of the turning on and turning off of these components reduces peak power demands and reduces overall current consumption. Fine frequency and timing estimations are then generated in the DBPSK Fine period (504). In one or more embodiments, the DBPSK Fine period (504) may include 30 symbols. The demodulation filter is then set and used to derive an improved estimate of the reference phase in DBPSK demodulation period (506). This represents the completion of the preamble setup turnaround time.

In one or more embodiments, the fine frequency estimator 110, fine timing estimator 112 and digital filter 126 are maintained in a power off state until after the coarse frequency and timing estimations and automatic gain control are complete. Further, the PSK correlator 108 is powered off after determining the coarse frequency and timing estimations and prior to performing digital equalization and channel filtering procedures on the received baseband signal in the automatic gain control path. This operations allows for significant current savings in the receiving architecture 100.

In one or more embodiments, fast settling automatic gain control is performed during the DC removal and settling phases (500) and the DBPSK Sync period (502), such that simultaneous frequency, automatic gain control and timing acquisition is obtained in a radio receiver in a very efficient and fast manner while achieving low power consumption. In one or more embodiments, slow (low pass filtered) automatic gain control may then be performed during the DBPSK Fine period (504), DBPSK demodulation period (506) and payload period (508).

Figure 6:
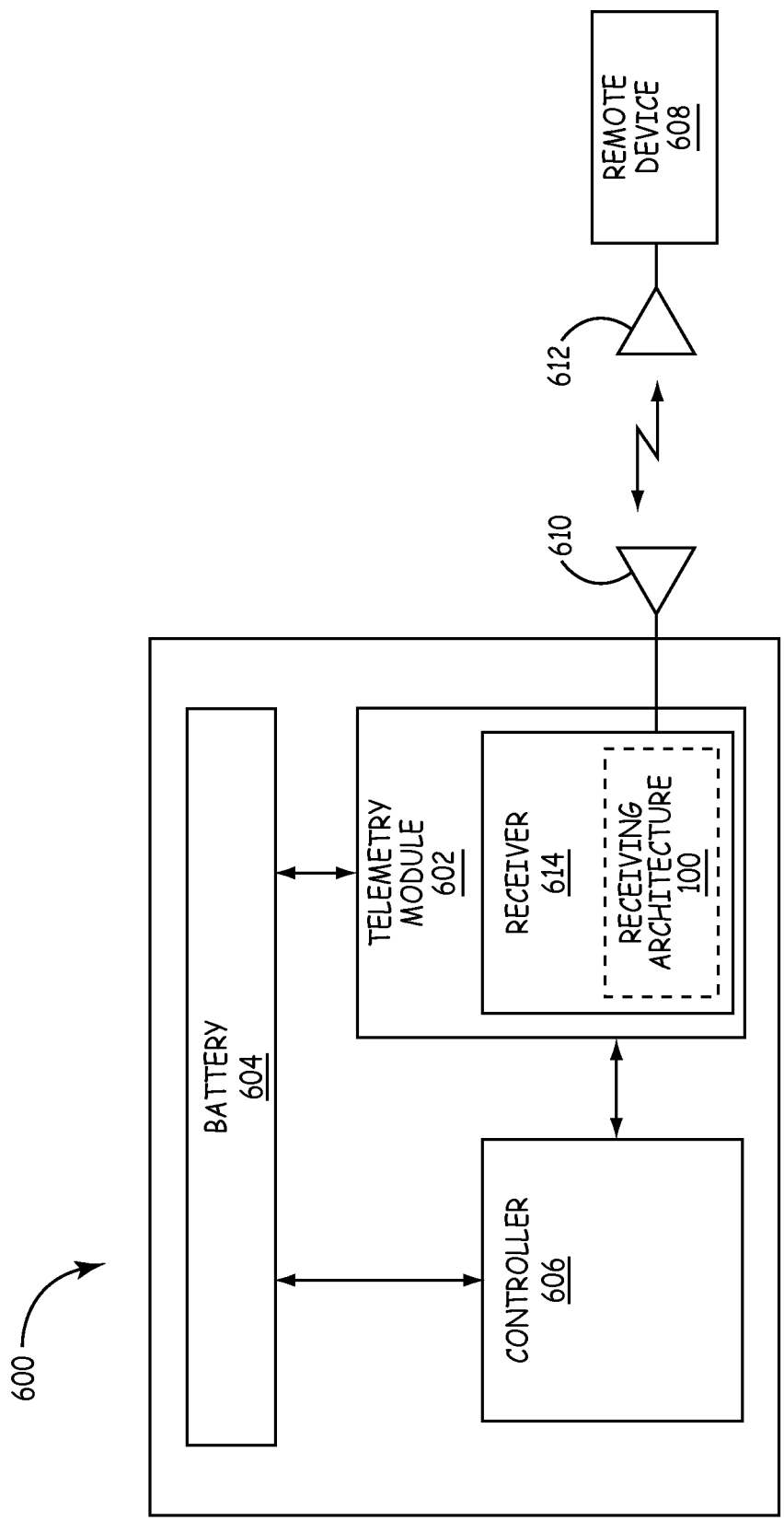
FIG. 6 is a block diagram illustrating the various components of one embodiment of an implantable medical device configured to operate in accordance with the present disclosure.

Various embodiments of the method and apparatus described herein allow for the simultaneous frequency, automatic gain control and timing acquisition in a radio receiver in a very efficient and fast manner while achieving low power consumption, which can be utilized in a variety of low power receiving architectures and devices. One such device is an implantable medical device (IMD). Since the battery capacity in an IMD is very limited, the power consumed by the components of the IMD can be conserved by using the various embodiments described herein to analyze the preamble of any communication signals intended for the IMD from external devices. Referring now to FIG. 6, a block diagram illustration is provided showing the constituent components of an IMD 600 in accordance with one embodiment having a microprocessor-based architecture. IMD 600 is shown as including a telemetry module 602, a battery 604, and a controller 606. Telemetry module 602 may comprise any unit capable of facilitating wireless data transfer between IMD 600 and an remote device 608, where remote device 608 may comprise an external medical device, a programming device, a remote telemetry station, a base station for IMD 600, a physician-activated device, a patient-activated device, a display device or any other type of device capable of sending and receiving signals to and from IMD 600. Telemetry module 602 and remote device 608 are respectively coupled to antennas 610 and 612 for facilitating the wireless data transfer. Telemetry module 602 may be configured to perform any type of wireless communication. For example, telemetry module 602 may send and receive radio frequency (RF) signals, infrared (IR) frequency signals, or other electromagnetic signals. Any of a variety of modulation techniques may be used to modulate data on a respective electromagnetic carrier wave. Alternatively, telemetry module 602 may use sound waves for communicating data, or may use the patient's tissue as the transmission medium for communicating with a programmer positioned on the patients skin. In any event, telemetry module 602 facilitates wireless data transfer between IMD 600 and remote device 608. Telemetry module 602 includes a receiver 614 including the receiving architecture 100 for monitoring received communication signals and performing the preamble analyzes described herein.

Controller 606 may comprise any of a wide variety of hardware or software configurations capable of executing algorithms to control telemetry module 602, receiver 614, and other components. Example hardware implementations of controller 606 include implementations within an application specific integrated circuit (ASIC), a field programmable gate array (FPGA), a programmable logic device, specifically designed hardware components, one or more processors, or any combination thereof. If implemented in software, a computer readable medium, such as a memory in the IMD 10, may store computer readable instructions, e.g., program code, that can be executed by controller 24 to carry out one or more of the techniques described herein. For example, the memory may comprise random access memory (RAM), read-only memory (ROM), non-volatile random access memory (NVRAM), electrically erasable programmable read-only memory (EEPROM), flash memory, or the like. Telemetry module 602 may likewise comprise any of a wide variety of the above-listed hardware or software configurations capable of executing algorithms for facilitating wireless telemetry.

IMDs typically must rely entirely on an implanted power source, e.g., battery 604. It is desirous to keep the physical size of IMD 600 to a minimum, which further places limitations on the size of the implanted battery 604. The various components of IMD 600 (i.e., telemetry module 602, controller 606, receiver 614) rely on battery 604 for power. For embodiments of IMD 600 that have nonrechargeable batteries 604, IMD 600 typically must be surgically replaced when battery 604 is fully depleted. For embodiments of IMD 600 having rechargeable batteries 604, a surgical procedure is not required when battery 604 is depleted, however, battery 604 must be recharged more frequently since it cannot store as much energy. Thus, power conservation is particularly important in an IMD 600.

While the system and method have been described in terms of what are presently considered to be specific embodiments, the disclosure need not be limited to the disclosed embodiments. It is intended to cover various modifications and similar arrangements included within the spirit and scope of the claims, the scope of which should be accorded the broadest interpretation so as to encompass all such modifications and similar structures. The present disclosure includes any and all embodiments of the following claims.

The invention claimed is:

1. A method comprising:
   receiving a radio frequency (RF) baseband signal in a radio receiver;
   splitting the received RF baseband signal into first and second identical versions of the received RF baseband signal;
   processing the first version of the received RF baseband signal in a limited phase-shift keying (PSK) correlation path that includes
      limiting the first version of the received RF baseband signal to generate a limited version of the received RF baseband signal having limited data,
      operating a correlator on the limited version of the received RF baseband signal to simultaneously determine coarse frequency and timing estimations for the received RF baseband signal; and
   processing the second version of the received RF baseband signal in an automatic gain control path that includes performing automatic gain control on the second, non-limited version of the received RF baseband signal substantially simultaneously with the coarse frequency and timing estimations determined by the correlator in the limited phase-shift keying (PSK) correlation path.

2. The method of claim 1, further comprising operating the correlator on the limited version of the received RF baseband signal to provide packet synchronization detection on the limited version of the received RF baseband signal substantially simultaneous with the determination of the coarse frequency and timing estimations.

3. The method of claim 1, further comprising operating the correlator at a sample rate of the received RF baseband signal that is substantially greater than a symbol rate of the received RF baseband signal.

4. The method of claim 1, wherein the received RF baseband signal is a differential binary phase shift keying (DBPSK) signal and the correlator is a DBPSK correlator.

5. The method of claim 1, further comprising performing at least one of a fine frequency estimation and a fine timing estimation after the automatic gain control and the coarse frequency and timing estimations are complete.

6. The method of claim 5, further comprising retaining a fine frequency estimator and a fine the timing estimator for respectively determining the fine frequency estimation and the timing estimations in a power off state until after the coarse frequency and timing estimations are complete.

7. The method of claim 5, further comprising powering off the correlator after determining the coarse frequency and timing estimations.

8. The method of claim 5, further comprising powering off the correlator prior to performing digital equalization and channel filtering procedures on the received RF baseband signal in the automatic gain control path.

9. The method of claim 5, further comprising performing the fine frequency estimation of the received RF baseband signal using a Kay weighted phase averaging algorithm.

10. The method of claim 9, further comprising correcting the fine frequency estimation to account for noise in the received RF baseband signal.

11. The method of claim 5, further comprising performing the fine timing estimation of the received RF baseband signal using a data-directed zero-crossing detector (ZCD).

12. The method of claim 1, wherein the limited phase-shift keying (PSK) correlation path and the automatic gain control path are separate, parallel paths.

13. A receiving architecture comprising:
   a limiter configured to input a first version of a received RF baseband signal and output a limited version of the received RF baseband signal having limited data
   a limiting phase-shift keying (PSK) correlator configured to obtain the limited version of the received RF baseband signal output by the limiter and simultaneously determine coarse frequency and timing estimations for the received baseband signal using the limited version of the received baseband signal; and
   an automatic gain control unit configured to perform automatic gain control on a second, non-limited version of the received RF baseband signal substantially simultaneously with the coarse frequency and timing estimations performed by the limiting PSK correlator, wherein the second, non-limited version of the received baseband signal is identical to the first version of the received RF baseband signal input to the limiter.

14. The receiving architecture of claim 13, wherein the limiting PSK correlator performs packet synchronization detection on the limited baseband signal substantially simultaneously with the determination of the coarse frequency and timing estimations.

15. The receiving architecture of claim 13, wherein the correlator operates at a sample rate of the received RF baseband signal that is substantially greater than a symbol rate of the received RF baseband signal.

16. The receiving architecture of claim 13, further comprising performing a fine frequency estimator for generating a fine frequency estimation of the non-limited version of the baseband signal after the automatic gain control and the coarse frequency and timing estimations are complete.

17. The receiving architecture of claim 16, wherein the fine frequency estimator includes a Kay weighted phase averager.

18. The receiving architecture of claim 13, further comprising performing a fine timing estimator for generating a fine timing estimation of the non-limited version of the baseband signal after the automatic gain control and the coarse frequency and timing estimations are complete.

19. The receiving architecture of claim 18, wherein the fine frequency estimator includes a data-directed zero-crossing detector (ZCD).

20. The receiving architecture of claim 13, wherein the limiting phase-shift keying (PSK) correlator is part of a first receive path and the automatic gain control unit is part of a second receive path separate from the first receive path.

21. The receiving architecture of claim 20, wherein the first and second receive path are parallel receive paths.

* * * * *

UNITED STATES PATENT AND TRADEMARK OFFICE
CERTIFICATE OF CORRECTION

PATENT NO. : 8,509,355 B2  
APPLICATION NO. : 12/165373  
DATED : August 13, 2013  
INVENTOR(S) : Bradley et al.

Page 1 of 1

It is certified that error appears in the above-identified patent and that said Letters Patent is hereby corrected as shown below:

In the Claims

Col. 13, line 53, claim 1, delete "...received RF baseband..." and insert in place thereof -- "...received baseband..." --;

Col. 13, line 55, claim 1, delete "...received RF baseband..." and insert in place thereof -- "...received baseband..." --;

Col. 13, line 62, claim 1, delete "...received RF baseband..." and insert in place thereof -- "...received baseband..." --;

Col. 13, line 67, claim 1, delete "...received RF baseband..." and insert in place thereof -- "...received baseband..." --;

Col. 14, line 27, claim 6, delete "... and a fine the timing estimator..." and insert in place thereof -- "... and a fine timing estimator..." --;

Col. 14, line 51, claim 13, delete "...received RF baseband..." and insert in place thereof -- "...received baseband..." --;

Col. 14, line 53, claim 13, delete "...signal having limited data a limiting..." and insert in place thereof -- "...signal having limited data; a limiting..." --;

Col. 15, line 7, claim 15, delete "...received RF baseband..." and insert in place thereof -- "...received baseband..." --;

Col. 15, line 9, claim 15, delete "...received RF baseband..." and insert in place thereof -- "...received baseband..." --.

Signed and Sealed this  
Tenth Day of June, 2014

Michelle K. Lee  
*Deputy Director of the United States Patent and Trademark Office*